(12) United States Patent
Huang et al.

(10) Patent No.: US 11,903,123 B1
(45) Date of Patent: Feb. 13, 2024

(54) COMMON-MODE FILTERING FOR CONVERTING DIFFERENTIAL SIGNALING TO SINGLE-ENDED SIGNALING

(71) Applicant: Marvell Asia Pte Ltd, Singapore (SG)

(72) Inventors: Shaowu Huang, Sunnyvale, CA (US); Dance Wu, Palo Alto, CA (US)

(73) Assignee: Marvell Asia Pte Ltd, Singapore (SG)

( * ) Notice: Subject to any disclaimer, the term of this patent is extended or adjusted under 35 U.S.C. 154(b) by 0 days.

(21) Appl. No.: 17/654,316

(22) Filed: Mar. 10, 2022

Related U.S. Application Data

(60) Provisional application No. 63/159,345, filed on Mar. 10, 2021.

(51) Int. Cl.
*H05K 1/02* (2006.01)
*H04B 1/40* (2015.01)
*H03H 11/04* (2006.01)

(52) U.S. Cl.
CPC ........... *H05K 1/0245* (2013.01); *H03H 11/04* (2013.01); *H04B 1/40* (2013.01); *H05K 1/0243* (2013.01)

(58) Field of Classification Search
None
See application file for complete search history.

(56) References Cited

U.S. PATENT DOCUMENTS

| | | | | |
|---|---|---|---|---|
| 4,720,686 A | * | 1/1988 | Westwick | H03F 3/45479 330/258 |
| 10,944,584 B1 | * | 3/2021 | Cheng | H04L 12/2801 |
| 2011/0248774 A1 | * | 10/2011 | Hergault | H04B 3/56 327/524 |
| 2018/0024620 A1 | * | 1/2018 | Gardner | H04L 25/0298 713/323 |
| 2021/0036059 A1 | * | 2/2021 | Leng | H01L 24/81 |

* cited by examiner

*Primary Examiner* — Daniel C Puentes

(57) ABSTRACT

An interface in a communications system includes a physical layer transceiver (PHY) for coupling to a wireline channel medium, and for coupling to a functional device via a single-ended cable. The PHY is an integrated circuit (IC) device having first and second differential input/output (I/O) conductors for coupling to the functional device, an impedance element configured to terminate a first one of the differential I/O conductors to a system ground, a second one of the differential I/O conductors being coupled to the single-ended cable, and a common-mode filter coupled to both of the differential I/O conductors. The PHY may further include a printed circuit board (PCB), with the IC device being mounted on the PCB, the first and second differential I/O conductors being signal traces on the PCB. The single-ended cable may be a coaxial cable.

20 Claims, 7 Drawing Sheets

COMMON-MODE FILTERING FOR CONVERTING DIFFERENTIAL SIGNALING TO SINGLE-ENDED SIGNALING

CROSS REFERENCE TO RELATED APPLICATIONS

This disclosure claims the benefit of copending, commonly-assigned U.S. Provisional Patent Application No. 63/159,345, filed Mar. 10, 2021, which is hereby incorporated by reference herein in its entirety.

FIELD OF USE

This disclosure relates to common-mode filtering for a high-speed cable interface. More particularly, this disclosure relates to filtering common-mode noise to reduce interference when a differential signal is converted to a single-ended signal in a high-speed cable interface.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Wireline communication links for some high-speed networking applications operate under various standards that incorporate strict electromagnetic compatibility (EMC) requirements. Some of those links may include an interface on an integrated circuit device that operates using differential signaling, but converts to single-ended signaling outside the integrated circuit device, which could give rise to interference.

SUMMARY

In accordance with implementations of the subject matter of this disclosure, an interface in a radiofrequency (RF) wireline communications system includes a physical layer transceiver for coupling to a wireline channel medium, and for coupling to a functional device via a single-ended cable, the physical layer transceiver being an integrated circuit device having differential input/output conductors for coupling to the functional device, an impedance element configured to terminate a first one of the first and second differential input/output conductors to a ground of the communications system, a second one of the first and second differential input/output conductors being coupled to the single-ended cable, and a common-mode filter coupled to both of the first and second differential input/output conductors.

A first implementation of such an interface may further include a printed circuit board, the physical layer transceiver integrated circuit device being mounted on the printed circuit board, and first and second differential signal traces on the printed circuit board coupled to the differential input/output conductors, where the impedance element terminates a first one of the first and second differential signal traces to the ground of the communications system, and the common-mode filter is coupled to both of the first and second differential signal traces.

According to a first aspect of that first implementation, the interface may further include a single-ended cable connector mounted on the printed circuit board, where a second one of the first and second differential signal traces is coupled to the single-ended cable connector.

A first instance of that first aspect may further include a shielded single-ended cable coupled to the single-ended cable connector. In a variant of that first instance, the shielded single-ended cable may be a coaxial cable.

In a second implementation of such an interface, the physical layer transceiver integrated circuit device may include an integrated circuit die mounted on a substrate, and the common-mode filter coupled to both of the first and second differential input/output terminals may be mounted on the substrate.

In a third implementation of such an interface, the physical layer transceiver integrated circuit device may include an integrated circuit die, and the common-mode filter coupled to both of the first and second differential input/output conductors may be formed on the integrated circuit die.

In a fourth implementation of such an interface, the common-mode filter may include a common-mode choke configured to filter out common-mode signals on the first and second differential input/output conductors.

In a fifth implementation of such an interface, the common-mode filter may include an active filter configured to filter out common-mode signals on the first and second differential input/output conductors.

According to one aspect of that fifth implementation, the active filter may include an amplifier and a transformer configured to filter out common-mode signals on the first and second differential input/output conductors.

According to implementations of the subject matter of this disclosure, a method of coupling a physical layer transceiver, in a radiofrequency (RF) wireline communications system, to a functional device via a single-ended cable, where the physical layer transceiver is an integrated circuit device having first and second differential input/output conductors for coupling to the functional device, includes terminating a first one of the first and second differential input/output conductors to a ground of the communications system, a second one of the first and second differential input/output conductors being coupled to the single-ended cable, and coupling a common-mode filter to both of the first and second differential input/output conductors to filter out common-mode signals on the first and second differential input/output conductors.

In a first implementation of such a method, where the physical layer transceiver integrated circuit device is mounted on a printed circuit board, and first and second differential signal traces on the printed circuit board are coupled to the differential input/output conductors, terminating the first one of the first and second differential input/output conductors to the ground of the communications system may include terminating a first one of the first and second differential signal traces to the ground of the communications system, and coupling the common-mode filter to both of the first and second differential input/output terminals may include coupling the common-mode filter to both of the first and second differential signal traces.

According to a first aspect of that first implementation, where a single-ended cable connector is mounted on the printed circuit board, the method may further include coupling a second one of the first and second differential signal traces to the single-ended cable connector.

In a first instance of that first aspect, the method may further include coupling a shielded single-ended cable to the single-ended cable connector.

In a variant of that first instance, coupling the shielded single-ended cable to the single-ended cable connector may include coupling a coaxial cable to the to the single-ended cable connector.

A second implementation of such a method, where the physical layer transceiver integrated circuit device includes an integrated circuit die mounted on a substrate, may further include forming the common-mode filter, that is coupled to both of the first and second differential input/output terminals, on the integrated circuit die.

A third implementation of such a method, where the physical layer transceiver integrated circuit device comprises an integrated circuit die mounted on a substrate, may further include forming the common-mode filter, that is coupled to both of the first and second differential input/output conductors, on the substrate, to filter out common-mode signals on the first and second differential input/output conductors.

In a fourth implementation of such a method, coupling the common-mode filter to both of the first and second differential input/output terminals may include coupling a common-mode choke to both of the first and second differential input/output conductors to filter out common-mode signals on the first and second differential input/output conductors.

In a fifth implementation of such a method, coupling the common-mode filter to both of the first and second differential input/output conductors comprises coupling an active filter to both of the first and second differential input/output conductors to filter out common-mode signals on the first and second differential input/output conductors.

According to an aspect of that fifth implementation, coupling the active filter to both of the first and second differential input/output conductors may include coupling an amplifier and a transformer to both of the first and second differential input/output conductors.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
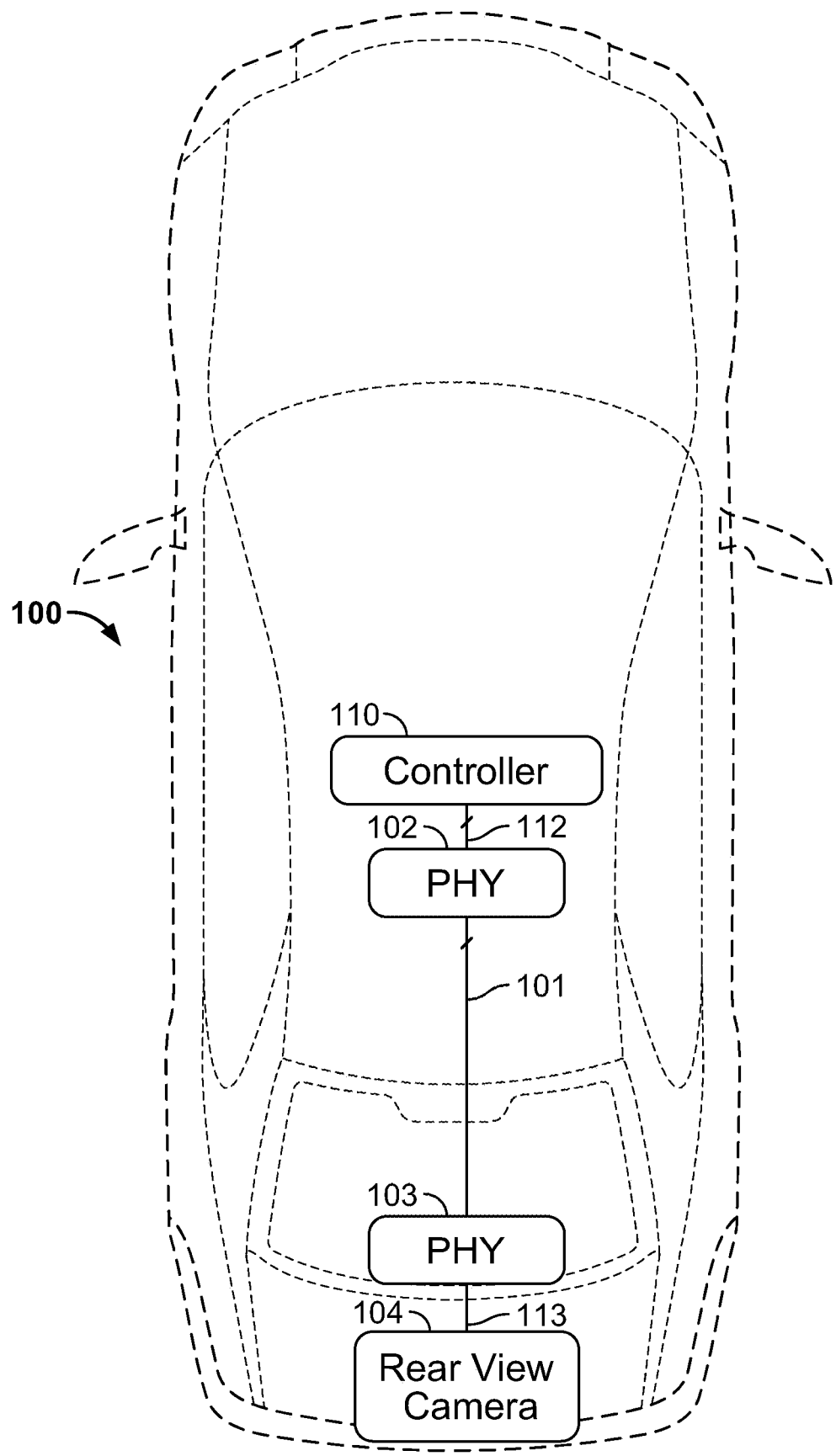
FIG. 1 shows a portion of a wireline radiofrequency communications system with which the subject matter of this disclosure may be used.

As noted above, wireline communication links for some high-speed networking applications operate under various standards that incorporate strict electromagnetic compatibility (EMC) requirements. Those applications may include, but are not limited to, automotive Ethernet under the IEEE 802.3bp, 802.3bw, 802.3ch and 802.3cy standards, as well as the A-PHY long-reach SerDes standard of the MIPI Alliance, Inc., and standards set by the NAV Alliance and the Automotive SerDes Alliance (ASA). However, the subject matter of this disclosure also may be relevant to other wireline radiofrequency (RF) signaling applications. Some of those links may include an interface on an integrated circuit device that operates using differential signaling, but converts to single-ended signaling outside the integrated circuit device.

For example, in an automotive Ethernet implementation, the automotive Ethernet network may operate using differential signaling, but the connection from a physical layer transceiver of that automotive network to a functional device (e.g., a sensor or transducer device such as video camera) may be a single-ended connection such as a coaxial cable or other shielded single-ended cable. Typically, conversion from a differential signal to a single-ended signal is accomplished by simply terminating one of the differential legs (normally the negative, or "N," leg) and using the other differential leg (normally the positive, or "P," leg) as the single-ended signal.

However, in differential signaling, a common-mode interference signal may be induced in each of the differential legs. Because the interference signal is common to both legs, it is relatively straightforward to compensate for, or filter out, the common-mode interference. But if one of the differential legs is simply terminated to ground as suggested above, the common-mode interference signal on the remaining leg is more difficult to filter because the corresponding signal on the terminated leg is not available for comparison.

Therefore, in accordance with implementations of the subject matter of this disclosure, a common-mode filter is coupled between the differential legs of the differential signal upstream of the conversion of the differential signal to a single-ended signal. The common-mode filter filters out any common-mode signal that is coupled to both legs of the differential signal, while both components are still easily compared and isolated. Otherwise, conversion to a single-ended signal may convert the common-mode interference into an unbalanced component that remains to propagate as interference on the single-ended channel and is not easily filtered. The unused differential leg (e.g., the "N" leg), continues to be terminated to ground downstream of the common mode filter.

In some implementations, the common-mode filter may be a common-mode choke (e.g., suitable common mode chokes are sold by TDK Corporation, of Tokyo, Japan). A common-mode choke includes two coupled inductors—i.e., two coils wound on a single core in such a way that the windings are negatively coupled. Therefore, a common-mode choke passes differential signals because the magnetic flux in the two windings cancels out, but blocks common-mode signals because the magnetic flux in the two windings is additive. While any common-mode choke may be used as the common-mode filter, other types of common-mode filtering circuits—active or passive—may be used. For example, an active filter—e.g., incorporating an amplifier along with a transformer or common-mode choke—may be used.

The aforementioned physical layer transceiver may be an integrated circuit device, including an integrated circuit die mounted on a substrate, which is in turn mounted on a printed circuit board (PCB) including a connector for a shielded single-ended cable (e.g., a coaxial cable). Differential signal conductors may be brought out from the integrated circuit die, to the substrate, to the PCB where one of the conductors (e.g., the "N" conductor) is terminated to ground—e.g., through an impedance element, such as a 50Ω resistor—but the common-mode filter is coupled to the two differential conductors upstream of the termination impedance element.

Alternatively, the common-mode filter may be coupled to the differential conductors inside the integrated circuit package—e.g., on a substrate external to the integrated circuit die. In such an alternative, the termination of one conductor to ground also may be made inside the integrated circuit package, or may be made on the PCB as in the case of an external common-mode filter.

In another alternative, the common-mode filter may be coupled to the differential leads on the integrated circuit die. However, insofar as most common-mode filters include inductors, which consume substantial area when fabricated on an integrated circuit, forming a common-mode filter on the integrated circuit die may be the least practical alternative.

In general, incorporating the common-mode filter in the integrated circuit package would provide (1) a smaller form factor, lower parasitic induction and capacitance resulting from shorter and smaller component interconnections, (2) potentially better co-design and co-optimization, and (3) lowering of the complexity level of integration and design. On the other hand, an in-package implementation would (1) be smaller in size filter and therefore may not perform as well at lower frequencies as a board-level implementation, (2) have lower voltage/current/power tolerance than a board-level implementation, and (3) be more costly than a board-level implementation.

The subject matter of this disclosure may be better understood by reference to FIGS. 1-7.

FIG. 1 shows a portion 100 of a wireline RF communications system with which the subject matter of this disclosure may be used, in the context, by way of example, of an automotive Ethernet network. Wireline RF communications system 100 includes a cable 101 which has two conductors and serves as the channel medium for differential signaling. Each end of cable 101 is connected to a respective physical layer transceiver (PHY) 102, 103. In this implementation, PHY 102 is coupled to a central controller 110 by differential signal conductors 112.

Figure 2:
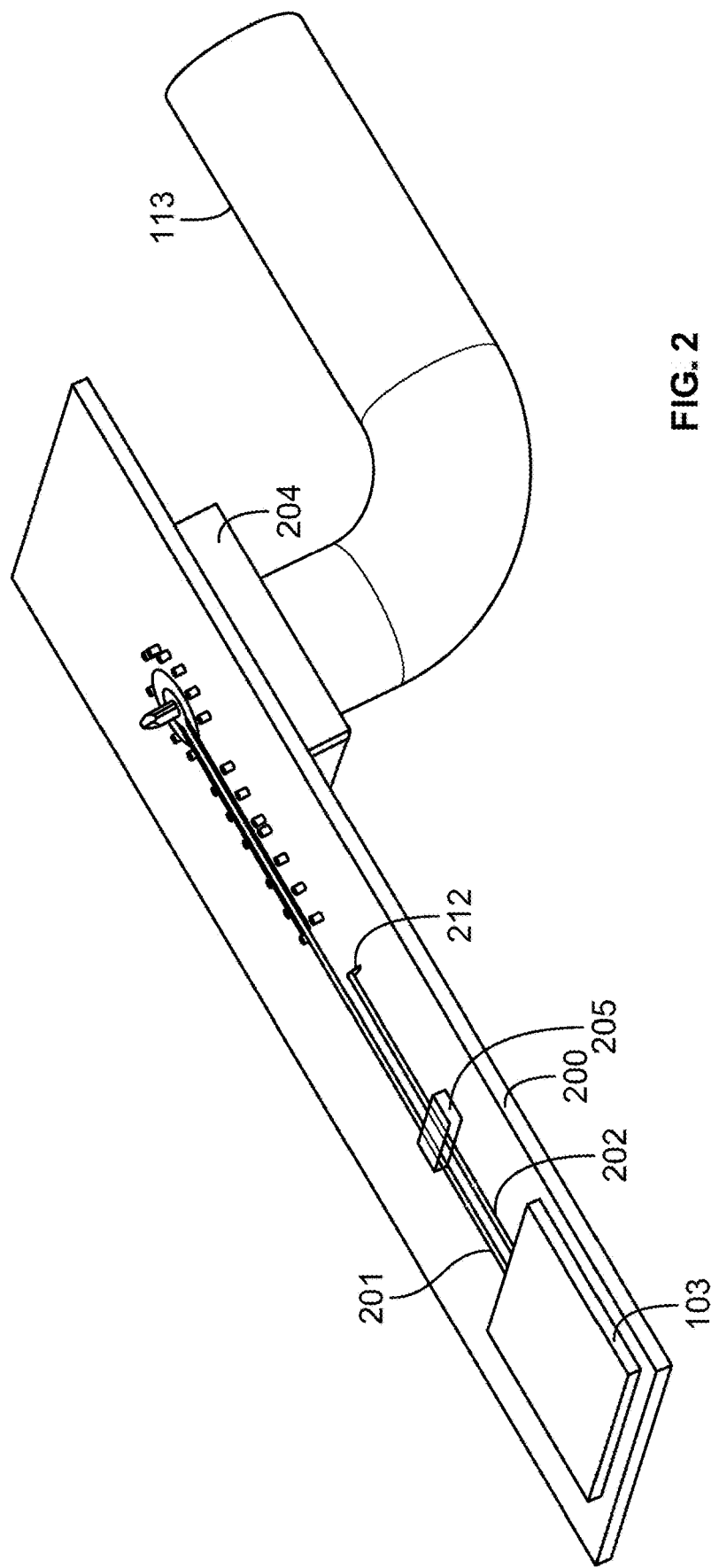
FIG. 2 is a perspective view of a printed circuit board incorporating implementations of the subject matter of this disclosure.

PHY 103 is coupled, in this implementation, to an automotive sensor or transducer such as a rear-view camera 104. For various reasons, such as weight reduction and/or the ability to provide power as well as data signaling, the link 113 to camera 104 may be a single-ended cable such as a coaxial cable or other shielded single-ended cable. As seen in FIG. 2, PHY device 103 is mounted on printed circuit board (PCB) 200. Differential input/output conductors of PHY 103 are coupled to two differential signal traces 201, 202 on PCB 200. Signal trace 202 is terminated at 212 to ground—e.g., via a impedance element, such as a 50Ω resistor (not shown in FIG. 2)—while signal trace 201 continues to coaxial cable connector 204, which may be coupled to coaxial cable 113. In accordance with implementations of the subject matter of this disclosure, a common-mode filter 205 is coupled across differential signal traces 201, 202 upstream of termination 212 (i.e., between PHY 103 and termination 212).

Figure 3:
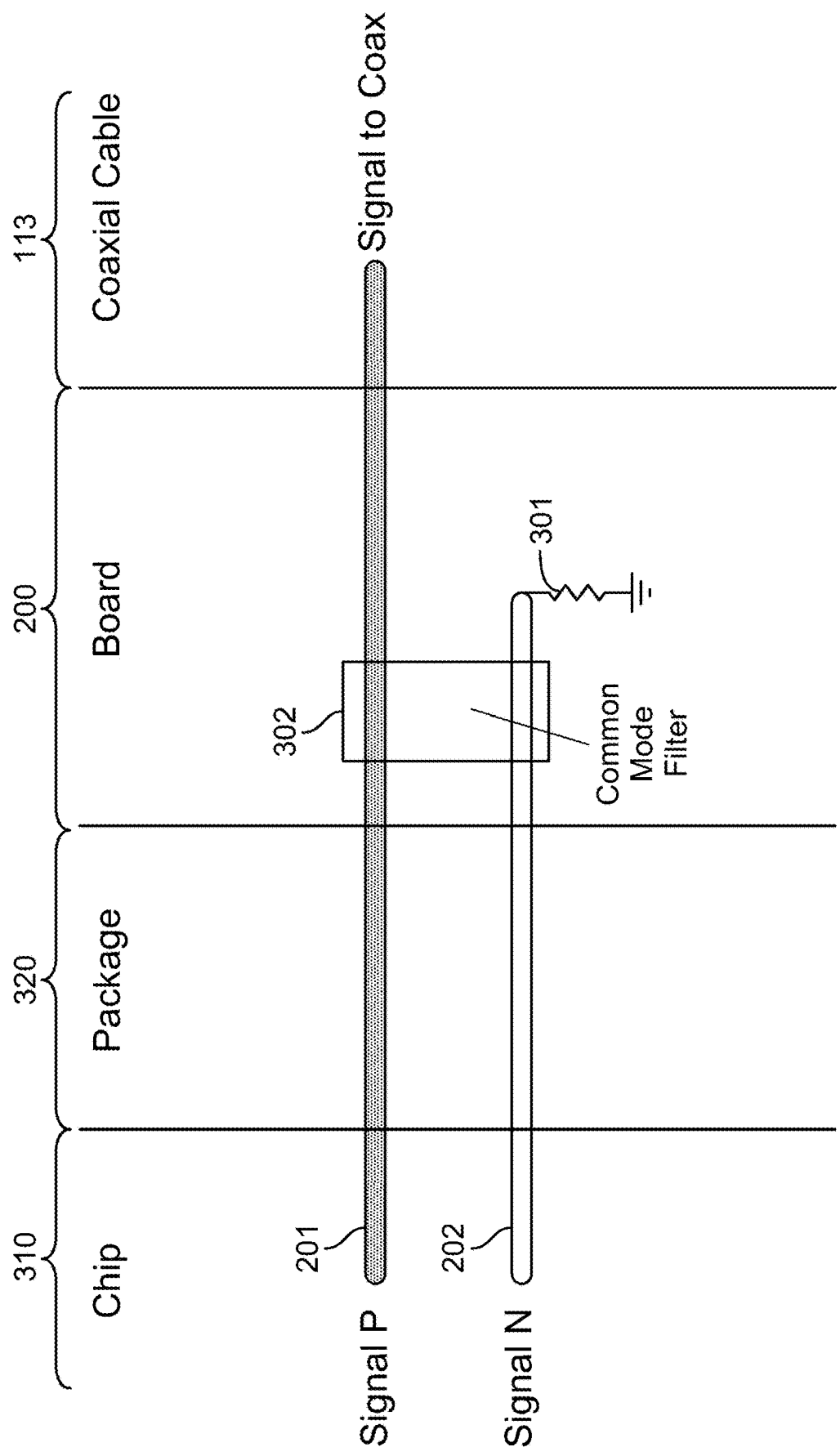
FIG. 3 is a schematic representation of the implementations of FIG. 2.

FIG. 3 is a corresponding schematic view, including trace 201 (the positive, or "P," signal) and trace 202 (the negative, or "N," signal) extending from integrated circuit die (or "chip") 310 of PHY 103, across the substrate 320 on which integrated circuit die 310 is packaged (see FIG. 6), and out to PCB 200. On PCB 200, a termination resistor 301 couples "N" trace 202 to ground, and a common-mode filter 302 is coupled across "P" and "N" traces 201, 202 upstream of termination resistor 301. "P" trace 202 continues out to coaxial cable 113.

Figure 4:
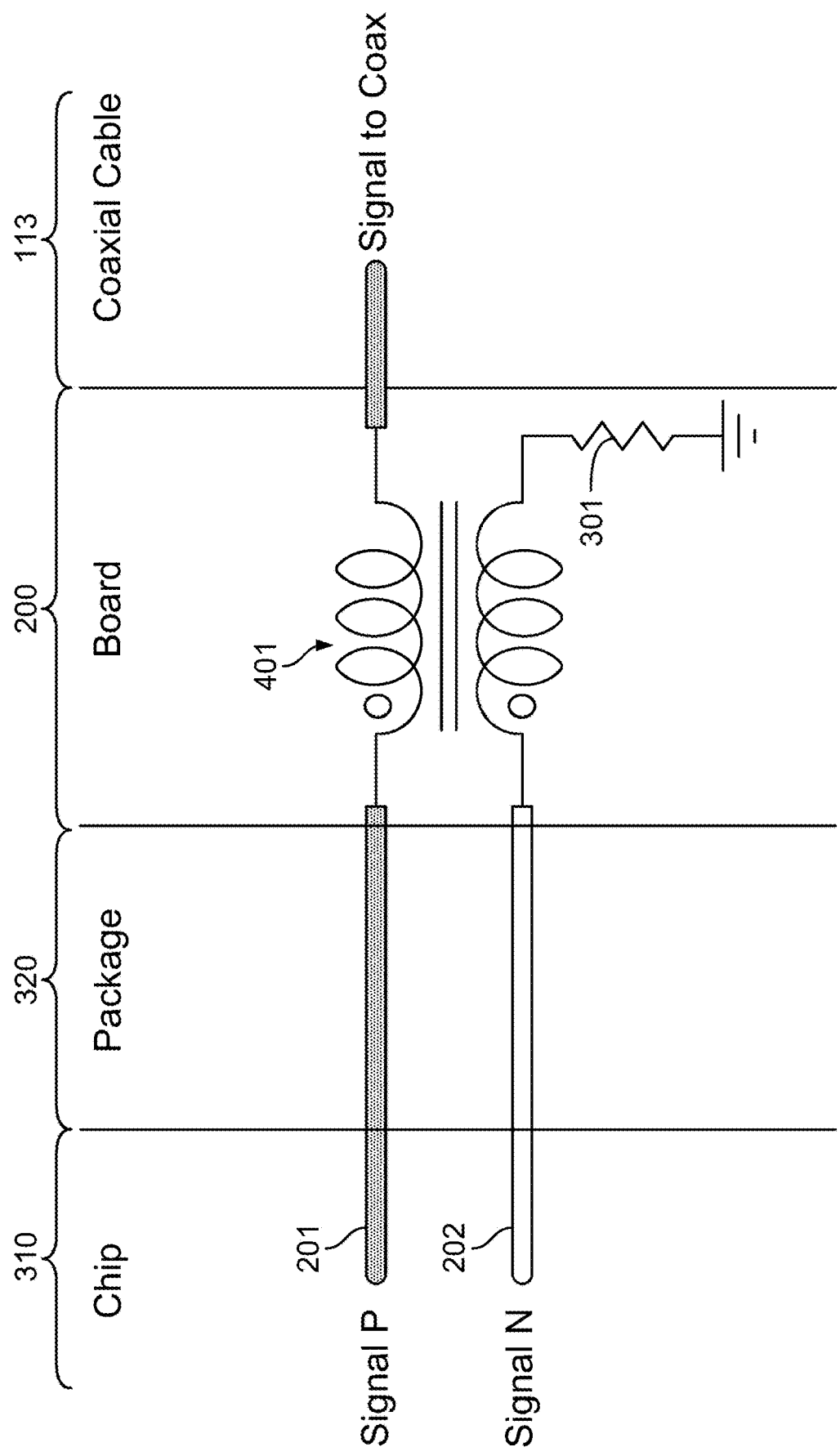
FIG. 4 is a schematic representation of a first implementation within the implementations of FIGS. 2 and 3.
Figure 5:
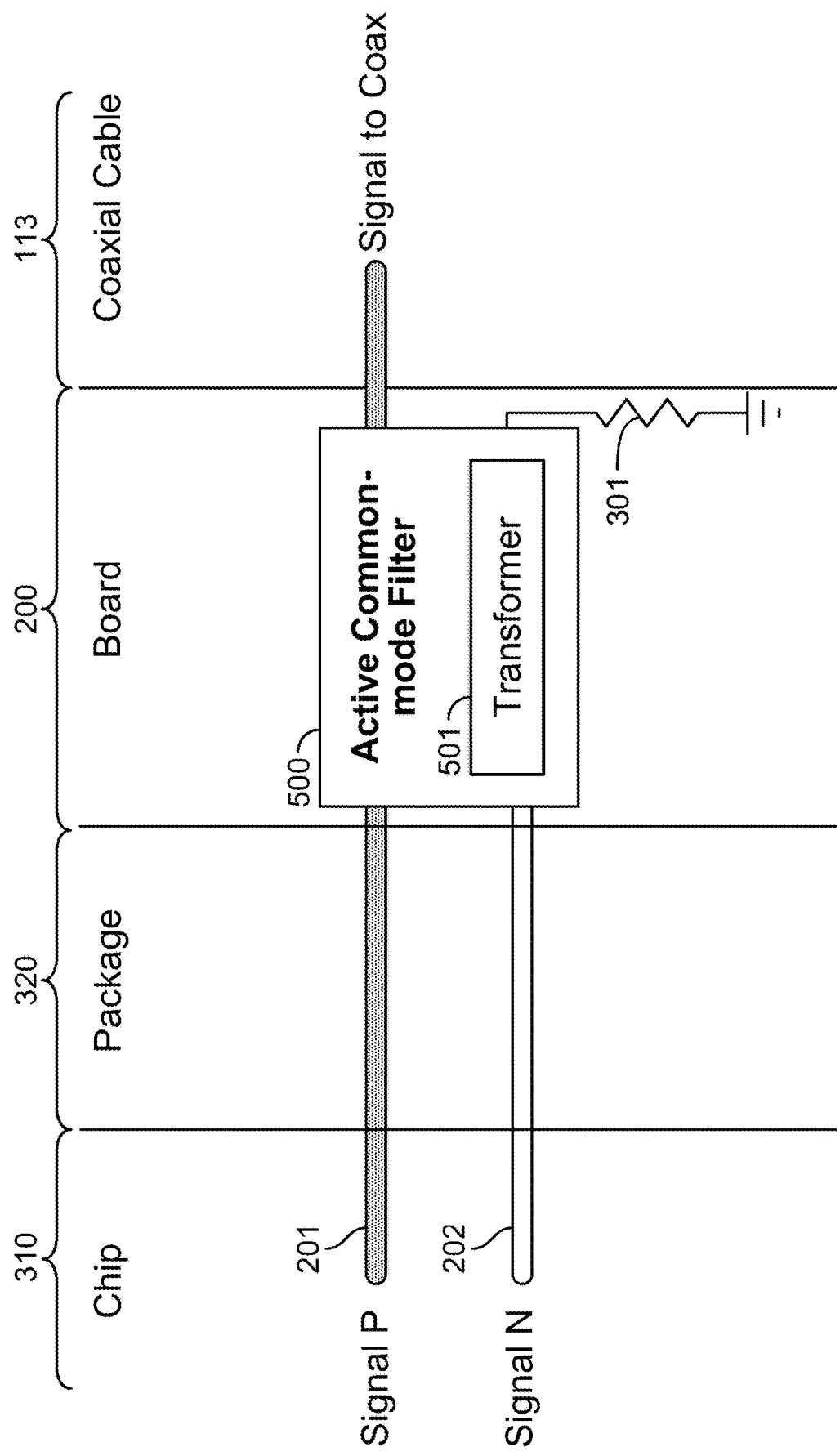
FIG. 5 is a schematic representation of a second implementation within the implementations of FIGS. 2 and 3.

FIG. 4 shows an implementation in which common-mode filter 302 is a common-mode choke 401 As noted above, there may be other implementations of common-mode filter 303. For example, common-mode filter 302 may be an active filter element such as a filter 500 incorporating a transformer 501 (FIG. 5).

Figure 6:
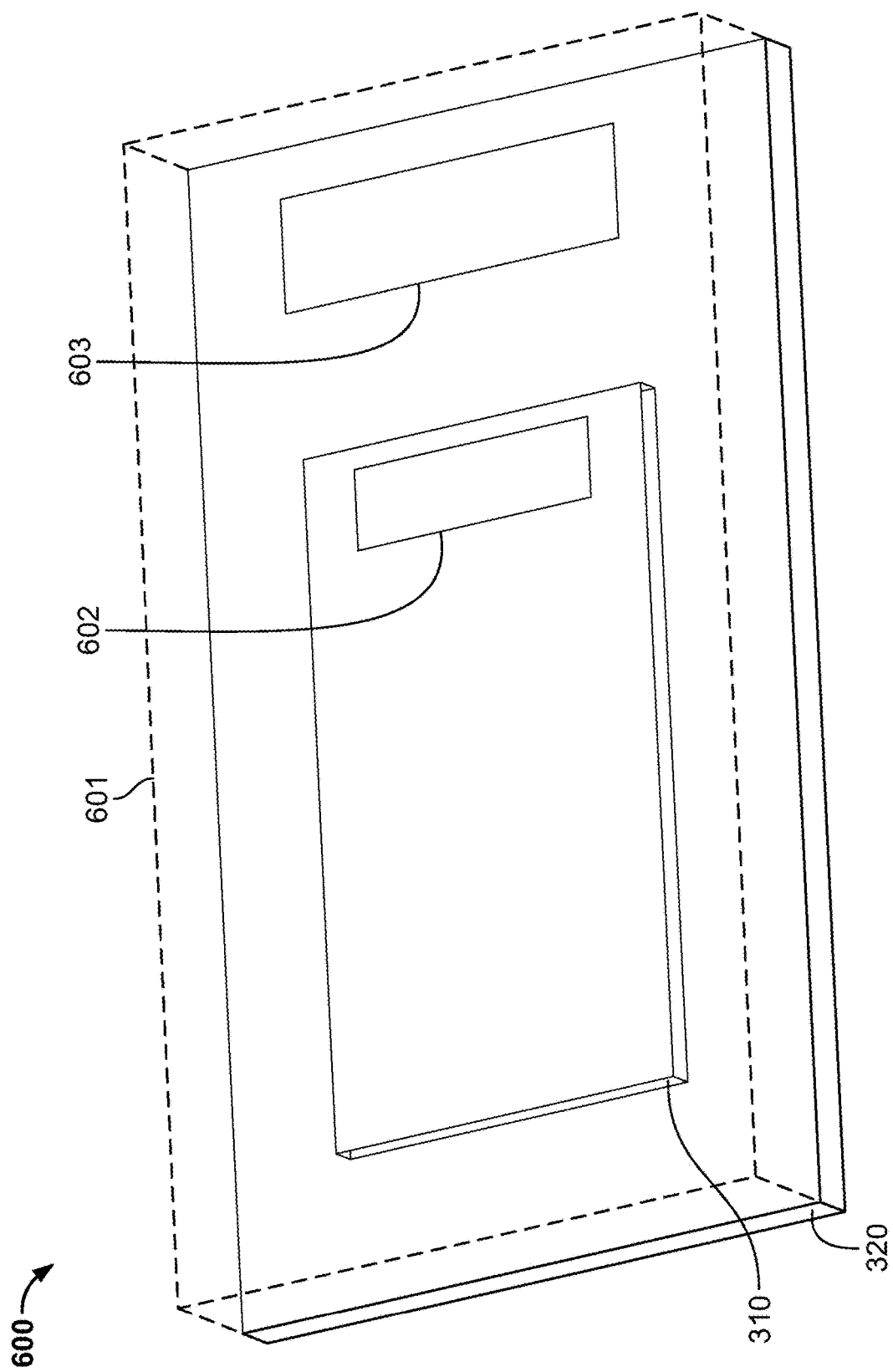
FIG. 6 is a simplified representation of the structure of an integrated circuit package incorporating implementations of the subject matter of this disclosure.

In the implementations described thus far, common-mode filter is coupled to differential traces 201, 202 on PCB 200. However, in other implementations of the subject matter of this disclosure, common-mode filter 303 may be implemented within package 600 housing PHY 103. As shown in FIG. 6, integrated circuit die 310 of PHY 103 is mounted on substrate 320, and the entire PHY 103 is encapsulated in packaging material 601 (indicated by broken lines). In some implementations, common-mode filter 303 may be formed as part of the circuitry of integrated circuit die 310—e.g., in an area 602 near an edge of integrated circuit die 310 where differential conductors 201, 202 may originate. In other implementations, common-mode filter 303 may be formed from discrete components mounted in portion 603 of substrate 320 within package 600 but outside integrated circuit die 310.

Figure 7:
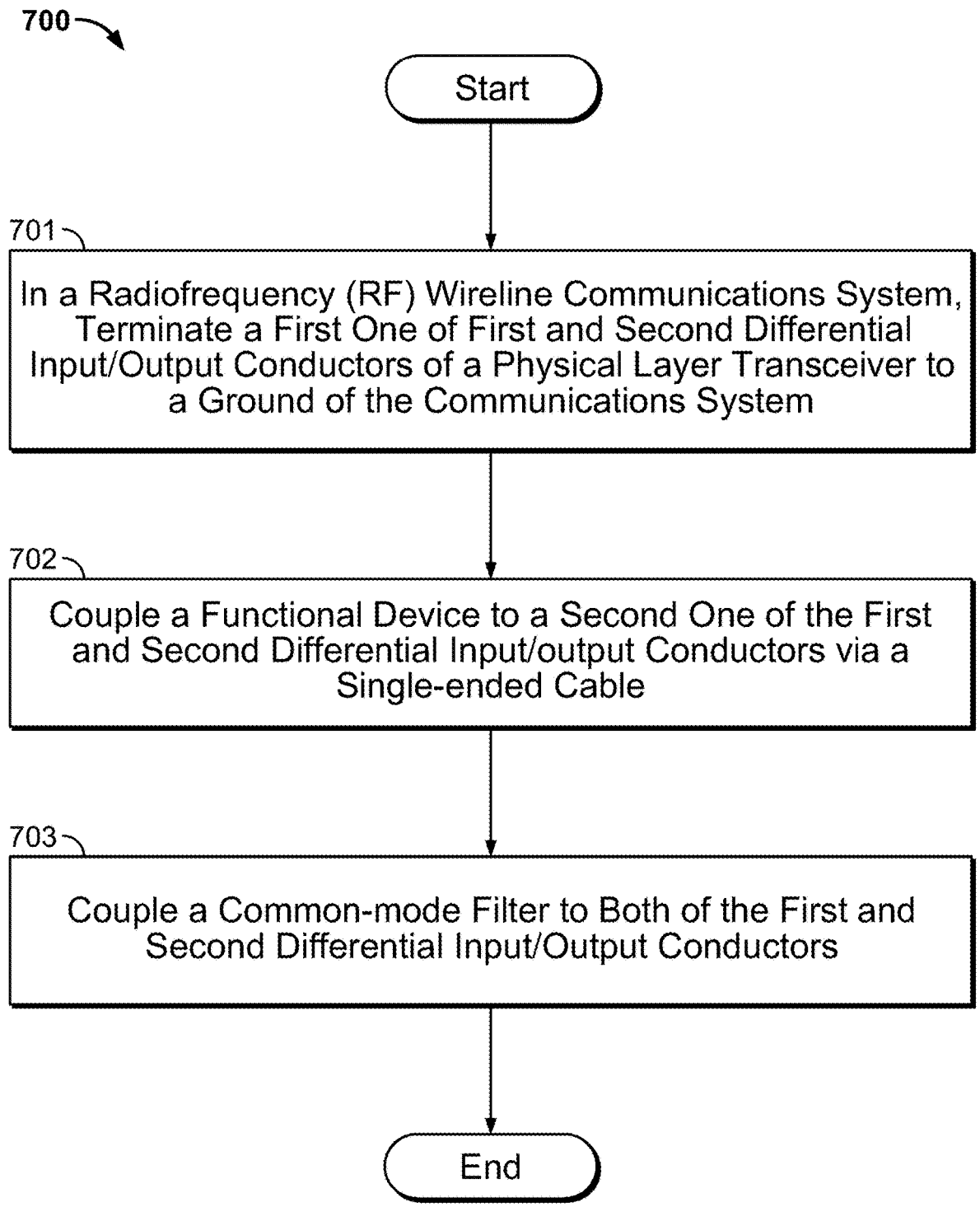
FIG. 7 is a flow diagram illustrating a method in accordance with implementations of the subject matter of this disclosure.

A method 700 according to implementations of the subject matter of this disclosure is diagrammed in FIG. 7. Method 700 begins at 701 where, in a radiofrequency (RF) wireline communications system, a first one of first and second differential input/output conductors of a physical layer transceiver is terminated to a ground of the communications system. At 702, a functional device is coupled to a second one of the first and second differential input/output conductors via a single-ended cable. At 703, a common-mode filter is coupled to both of the first and second differential input/output conductors, and method 700 ends.

Thus it is seen that high-speed cable interface in which common-mode noise is filtered to reduce interference when a differential signal is converted to a single-ended signal has been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. An interface in a radiofrequency (RF) wireline communications system, the interface comprising:
  a physical layer transceiver configured for coupling between a differential wireline channel medium and a functional device, the physical layer transceiver being an integrated circuit device having first and second differential wireline conductors configured for coupling to the differential wireline channel medium, and having first and second differential input/output conductors extending toward the functional device;
  an impedance element configured to terminate a first one of the first and second differential input/output conductors to a ground of the communications system between the physical layer transceiver and the functional device, a second one of the first and second differential input/output conductors being configured for coupling to a single-ended cable that is configured for coupling to the functional device; and a common-mode filter coupled, between the physical layer transceiver and the functional device, to both of the first and second differential input/output conductors.

2. The interface of claim 1 further comprising:

a printed circuit board, the physical layer transceiver integrated circuit device being mounted on the printed circuit board; and first and second differential signal traces on the printed circuit board coupled to the differential input/output conductors; wherein:

the impedance element terminates a first one of the first and second differential signal traces to the ground of the communications system; and the common-mode filter is coupled to both of the first and second differential signal traces.

3. The interface of claim 2 further comprising:

a single-ended cable connector mounted on the printed circuit board; wherein:

the second one of the first and second differential signal traces is coupled to the single-ended cable connector.

4. The interface of claim 3 wherein the single-ended cable comprises a shielded single-ended cable coupled to the single-ended cable connector.

5. The interface of claim 4 wherein the shielded single-ended cable comprises a coaxial cable.

6. The interface of claim 1 wherein:

the physical layer transceiver integrated circuit device comprises an integrated circuit die mounted on a substrate; and the common-mode filter coupled to both of the first and second differential input/output terminals is mounted on the substrate.

7. The interface of claim 1 wherein:

the physical layer transceiver integrated circuit device comprises an integrated circuit die; and the common-mode filter coupled to both of the first and second differential input/output conductors is formed on the integrated circuit die.

8. The interface of claim 1 wherein the common-mode filter comprises a common-mode choke configured to filter out common-mode signals on the first and second differential input/output conductors.

9. The interface of claim 1 wherein the common-mode filter comprises an active filter configured to filter out common-mode signals on the first and second differential input/output conductors.

10. The interface of claim 9 wherein the active filter comprises an amplifier and a transformer configured to filter out common-mode signals on the first and second differential input/output conductors.

11. A method of coupling a physical layer transceiver, in a radiofrequency (RF) wireline communications system, between a differential wireline channel medium and a functional device, the physical layer transceiver being an integrated circuit device having first and second differential wireline conductors configured for coupling to the differential wireline channel medium, and having first and second differential input/output conductors extending toward the functional device, the method comprising:

terminating a first one of the first and second differential input/output conductors to a ground of the communications system between the physical layer transceiver and the functional device;

coupling a second one of the first and second differential input/output conductors to a single-ended cable that is configured for coupling to the functional device; and coupling a common-mode filter to both of the first and second differential input/output conductors, between the physical layer transceiver and the functional device, to filter out common-mode signals on the first and second differential input/output conductors.

12. The method of coupling a physical layer transceiver to a functional device according to claim 11, wherein the physical layer transceiver integrated circuit device is mounted on a printed circuit board, and first and second differential signal traces on the printed circuit board are coupled to the differential input/output conductors; wherein:

terminating the first one of the first and second differential input/output conductors to the ground of the communications system comprises terminating a first one of the first and second differential signal traces to the ground of the communications system; and coupling the common-mode filter to both of the first and second differential input/output conductors comprises coupling the common-mode filter to both of the first and second differential signal traces.

13. The method of coupling a physical layer transceiver to a functional device according to claim 12, wherein a single-ended cable connector is mounted on the printed circuit board; the method further comprising:

coupling a second one of the first and second differential signal traces to the single-ended cable connector.

14. The method of coupling a physical layer transceiver to a functional device according to claim 13 wherein coupling the second one of the first and second differential input/output conductors to the single-ended cable comprises coupling a shielded single-ended cable to the single-ended cable connector.

15. The method of coupling a physical layer transceiver to a functional device according to claim 14 wherein coupling the shielded single-ended cable to the single-ended cable connector comprises coupling a coaxial cable to the to the single-ended cable connector.

16. The method of coupling a physical layer transceiver to a functional device according to claim 11 wherein the physical layer transceiver integrated circuit device comprises an integrated circuit die mounted on a substrate; the method comprising:

forming the common-mode filter, that is coupled to both of the first and second differential input/output conductors, on the integrated circuit die.

17. The method of coupling a physical layer transceiver to a functional device according to claim 11 wherein the physical layer transceiver integrated circuit device comprises an integrated circuit die mounted on a substrate; the method comprising:

forming the common-mode filter, that is coupled to both of the first and second differential input/output conductors, on the substrate, to filter out common-mode signals on the first and second differential input/output conductors.

18. The method of coupling a physical layer transceiver to a functional device according to claim 11 wherein coupling the common-mode filter to both of the first and second differential input/output conductors comprises coupling a common-mode choke to both of the first and second differential input/output conductors to filter out common-mode signals on the first and second differential input/output conductors.

19. The method of coupling a physical layer transceiver to a functional device according to claim 11 wherein coupling the common-mode filter to both of the first and second differential input/output conductors comprises coupling an active filter to both of the first and second differential input/output conductors to filter out common-mode signals on the first and second differential input/output conductors.

20. The method of coupling a physical layer transceiver to a functional device according to claim 19 wherein coupling the active filter to both of the first and second differential input/output conductors comprises coupling an amplifier and a transformer to both of the first and second differential input/output conductors.

\* \* \* \* \*